United States Patent
Lal et al.

(10) Patent No.: US 11,326,937 B2
(45) Date of Patent: May 10, 2022

(54) ENERGY HARVESTING APPARATUS AND METHODS FOR DETECTING A VIBRATORY SIGNAL

(71) Applicant: CORNELL UNIVERSITY, Ithaca, NY (US)

(72) Inventors: Amit Lal, Ithaca, NY (US); Sahil Gupta, Easton, CT (US); Sachin Nadig, Ithaca, NY (US); Benyamin Davaji, Ithaca, NY (US)

(73) Assignee: CORNELL UNIVERSITY, Ithaca, NY (US)

( * ) Notice: Subject to any disclaimer, the term of this patent is extended or adjusted under 35 U.S.C. 154(b) by 444 days.

(21) Appl. No.: 16/099,584

(22) PCT Filed: May 10, 2017

(86) PCT No.: PCT/US2017/031909
§ 371 (c)(1),
(2) Date: Nov. 7, 2018

(87) PCT Pub. No.: WO2017/196945
PCT Pub. Date: Nov. 16, 2017

(65) Prior Publication Data
US 2020/0309591 A1 Oct. 1, 2020

Related U.S. Application Data

(60) Provisional application No. 62/334,114, filed on May 10, 2016.

(51) Int. Cl.
*G01H 11/08* (2006.01)
*G01H 11/02* (2006.01)
(Continued)

(52) U.S. Cl.
CPC ............. *G01H 11/08* (2013.01); *G01H 11/02* (2013.01); *H01H 35/14* (2013.01); *H01L 41/22* (2013.01); *H02K 35/02* (2013.01)

(58) Field of Classification Search
CPC .... B81B 2201/0285; B81B 2201/0235; B81B 2201/025; G01H 11/08; G01P 15/09;
(Continued)

(56) References Cited

U.S. PATENT DOCUMENTS 6,630,894 B1 * 10/2003 Boyd .................. H03K 17/965
341/22
6,765,160 B1 * 7/2004 Robinson ............... H01H 35/14
200/61.45 R
(Continued)

OTHER PUBLICATIONS

Wayne Storr, LC Oscillator Tutorial and Tuned LC Oscillator Basics, Basic Electronics Tutorials (Year: 2015).*
(Continued)

*Primary Examiner* — David L Singer
(74) *Attorney, Agent, or Firm* — Barnes & Thornburg LLP

(57) ABSTRACT

A vibration transducer module for detecting a vibratory signal, comprising a base, a spring connected to the base at a first location, a mass mechanically coupled to the spring at a second location remote from the first location, and a wall configured to position a first wall electrode and a second wall electrode a selected distance from the first location, the conductive element positioned and sized to contact the first wall electrode and the second wall electrode. The mass comprises a conductive element, and an energy harvester to provide a first voltage signal. The energy harvester may comprise a piezoelectric material or be construct as a SAW device. The module may be combined with a rectifier and an oscillator to form a vibration sensor.

15 Claims, 5 Drawing Sheets

(51) Int. Cl.
    *H01H 35/14* (2006.01)
    *H01L 41/22* (2013.01)
    *H02K 35/02* (2006.01)

(58) Field of Classification Search
    CPC ............ G01P 15/0922; H01H 2201/02; H01H 35/14; H01H 35/15; H01H 35/144; H02N 2/186–188
    See application file for complete search history.

(56) References Cited

U.S. PATENT DOCUMENTS

| | | | |
|---|---|---|---|
| 2003/0193417 A1* | 10/2003 | Face | H03K 17/964 341/22 |
| 2004/0078662 A1* | 4/2004 | Hamel | B60C 23/0411 714/22 |
| 2006/0220803 A1* | 10/2006 | Kranz | G01P 15/0891 340/426.24 |
| 2007/0251294 A1 | 11/2007 | Tanaka et al. | |
| 2007/0273463 A1* | 11/2007 | Yazdi | G01P 15/18 335/78 |
| 2007/0285244 A1* | 12/2007 | Tucker | G06K 19/07764 340/572.1 |
| 2011/0018397 A1* | 1/2011 | Fujimoto | H01L 41/113 310/339 |
| 2011/0140577 A1* | 6/2011 | Galchev | H02N 2/186 310/339 |
| 2011/0210554 A1 | 9/2011 | Boysel | |
| 2012/0292915 A1* | 11/2012 | Moon | F01D 5/06 290/55 |
| 2014/0062256 A1 | 3/2014 | Buss et al. | |
| 2015/0013457 A1* | 1/2015 | Hada | G01P 15/097 73/514.29 |
| 2015/0287562 A1* | 10/2015 | Delamare | H01H 59/00 307/125 |
| 2016/0000061 A1* | 1/2016 | Boyd | A01M 31/002 340/539.32 |
| 2017/0148592 A1* | 5/2017 | Tabib-Azir | H01L 41/1132 |

OTHER PUBLICATIONS

Beeby et al., Review Article Energy harvesting vibration sources for microsystems applications, Institute of Physics Publishing, Measurement Science and Technology 17 (2006) R175-R195 (Year: 2006).*

Lee, D. G., et al., "Novel Micro Vibration Energy Harvesting Device using Frequency Up Conversion," Transducers 2007—2007 International Solid-State Sensors, Actuators and Microsystems Conference, Lyon, 2007, pp. 871-874.

Zorlu, Özge "A Vibration-Based Electromagnetic Energy Harvester Using Mechanical Frequency Up-Conversion Method," in IEEE Sensors Journal, vol. 11, No. 2, pp. 481-488, Feb. 2011.

Cavallier, B. et al. "Energy harvesting using vibrating structures excited by shock," IEEE Ultrasonics Symposium, 2005., 2005, pp. 943-945.

Sari, I. et al., "An Electromagnetic Micro Power Generator for Low-Frequency Environmental Vibrations Based on the Frequency Upconversion Technique," in Journal of Microelectromechanical Systems, vol. 19, No. 1, pp. 14-27, Feb. 2010.

Ashraf, K. et al., "An Energy Pumping Frequency Increased Vibration Energy Harvester," in PowerMEMS, Dec. 2012.

Berdy, D. et al., "Compact Low Frequency Meandered Piezoelectric Energy Harvester," in PowerMEMS, 2009.

Jiang, H. et al., "A Motion-Powered Piezoelectric Pulse Generator for Wireless Sensing via FM Transmission," in IEEE Internet of Things Journal, vol. 2, No. 1, pp. 5-13, Feb. 2015.

Ferrari, M. et al., "An autonomous battery-less sensor module powered by piezoelectric energy harvesting with RF transmission of multiple measurement signals," in Smart Materials and Structures, Aug. 2009.

Shenck, N.S., et al., "Energy scavenging with shoe-mounted piezoelectrics," in Micro, IEEE , vol. 21, No. 3, pp. 30-42, May/Jun. 2001.

International Search Report and Written Opinion for PCT Application No. PCT/US2017/031909 dated Aug. 18, 2017; Forms PCT/ISA/210 and PCT/ISA/237; 12 pages.

* cited by examiner

ENERGY HARVESTING APPARATUS AND METHODS FOR DETECTING A VIBRATORY SIGNAL

CROSS REFERENCE

This application is a U.S. National Phase filing of International Application No. PCT/US2017/031909 filed May 10, 2017, which itself claims the benefit of the filing date of U.S. Provisional Patent Application Ser. No. 62/334,114 filed May 10, 2016, each of which is hereby incorporated by reference in its entirety.

This invention was made with government support awarded under US Army grant number W31P4Q-12-1-0003 and Defense Advanced Research Projects Agency grant number HR0011-15-C-0140. The government has certain rights in this invention.

FIELD

Apparatus and methods for detecting a vibratory signal, and in particular apparatus and methods for detecting a relatively low frequency vibratory signal and providing a high frequency electromagnetic signal.

BACKGROUND

Numerous apparatus have been proposed to detect low frequency vibration and generate corresponding electrical signals. Additionally, there have been apparatus proposed to generate a wireless signal in response to low frequency vibrations.

There remains a need for more reliable, more easily manufactured, more physically robust, and/or cost-sensitive apparatus for detecting and/or providing a wireless signal corresponding to the low frequency vibrations.

SUMMARY

In accordance with one aspect of the present invention, there is provided a vibration transducer module for detecting a vibratory signal, comprising a base, a spring connected to the base at a first location, a mass mechanically coupled to the spring at a second location remote from the first location, the mass comprising a conductive element, and an energy harvester (also referred to herein as an energy scavenger) to provide a first voltage signal. The module further comprising a wall configured to position a first wall electrode and a second wall electrode a selected distance from the first location, the conductive element positioned and sized to contact the first wall electrode and the second wall electrode.

The module may be incorporated into a vibration sensor, further comprising a rectifier having an input coupled to the energy harvester to receive the first voltage signal and adapted to provide a rectified first voltage signal as an output; and an oscillator comprising a capacitive element coupled to receive and maintain a charge corresponding to the rectified first voltage signal from the rectifier, and the oscillator caused to oscillate when the vibratory signal flexes the spring such that the conductive element contacts the first wall electrode and the second wall electrode.

In some embodiments, the energy harvester comprises a piezoelectric bimorph comprising a first conductive layer and a second conductive layer, and a piezoelectric layer extending between the first conductive layer and the second conductive layer to provide the first voltage signal. The piezoelectric layer may comprise lead zirconate titanate.

The spring may be a serpentine spring. The piezoelectric bimorph may be a spiral bimorph.

In some embodiments, the base constitutes a portion of a frame extending in more than one direction around the mass. The wall may constitute a portion of the frame. The frame may form a single integrated structure.

In some embodiments, the module further comprises a second spring mechanically coupling the mass to the frame.

The oscillator may comprise an inductive element coupled to the capacitor. In some embodiments, the oscillator is a surface acoustic wave device. The rectifier may be a full-wave rectifier.

In accordance with another aspect of the present invention, there is provided a method of sensing a vibratory signal, comprising vibrating a mass-spring system comprising a mass comprising an energy harvester and a conductive element, transferring a charge from the energy harvester through a rectifier to a capacitor of an oscillator, and generating an oscillatory signal by activating the oscillator with the conductive element. Vibrating the mass-spring system may include locating the mass-spring system where is can receive the vibratory signal.

In some instances of the method, the energy harvester comprises a piezoelectric bimorph to generate the charge. The piezoelectric bimorph may be a spiral bimorph.

The step of generating an oscillatory signal may comprise connecting the capacitor to an inductive element via the conductive element.

In some instances the oscillator comprises a surface acoustic wave device.

These and other aspects of the present invention will become apparent upon a review of the following detailed description and the claims appended thereto.

DETAILED DESCRIPTION

Aspects of the present invention will be further illustrated with reference to the following specific examples. It is understood that these examples are given by way of illustration and are not meant to limit the disclosure or the claims to follow.

Figure 1:
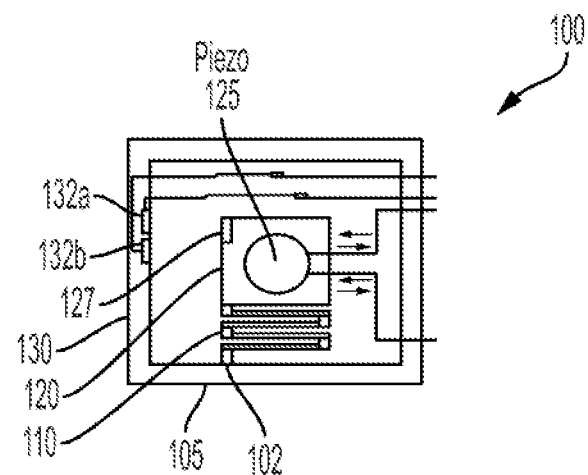
FIG. 1 is a schematic illustration of an example of a vibration transducer module according to aspects of the present invention when the spring is relaxed state.

FIG. 1 is a schematic illustration of an example of a vibration transducer module 100 according to aspects of the present invention. FIG. 1 is an illustration of module 100 when spring 110 is in a relaxed state. Module 100 comprises a base 105, spring 110 having a mass 120 coupled thereto (the mass comprising a piezoelectric bimorph 125 and a conductive element 127) and a wall 130 maintaining a first electrode 132a and a second electrode 132b.

Spring 110 is connected to the base at a location 102. Mass 120 is mechanically coupled to spring 110 at a second location remote from first location 102. As described herein, mass 120 and spring 110 operate in as a conventional mass-spring system with the elastic properties of the spring allowing the spring to move in response to vibrations (also referred to herein as a vibratory signal). Spring 110 is constructed to be operable between a first, relaxed state (shown in FIG. 1), where conductive element 127 is separated from first electrode 132a and second electrode 132b, and a second, extended state (as shown in FIG. 5) in which conductive element 127 is in contact with both first electrode 132a and second electrode 132b.

In some embodiments, spring 110 is configured as a serpentine spring (shown in FIG. 1), although other configurations may be used (e.g., a coil spring). Mass 120 need not have any particular shape or size other than having appropriate mass to achieve a desired response to vibration (e.g., a resonance response following a well-known expression for a resonance frequency of a spring-mass system (Equation 1), or a non-resonance response, such that the first relaxed state and the second extended state can be achieved in response to a vibratory signal of a selected magnitude.

$$f_{res} = \sqrt{\frac{k}{m}}$$ Equation 1 where $f_{res}$ is the resonant frequency, m is mass, and k is the spring constant Conductive element 125 may be made of any suitable material capable for forming an electric circuit such that an oscillator circuit can be closed to facilitate oscillation in the manner described below. The size and position of conductive element 127 are selected in conjunction with the properties of spring 110 and mass 120 in view of the vibratory signal to be measured. Conductive element 127 is sized and shaped to be able to contact first electrode 132a and second electrode 132b, simultaneously.

Figure 3A:
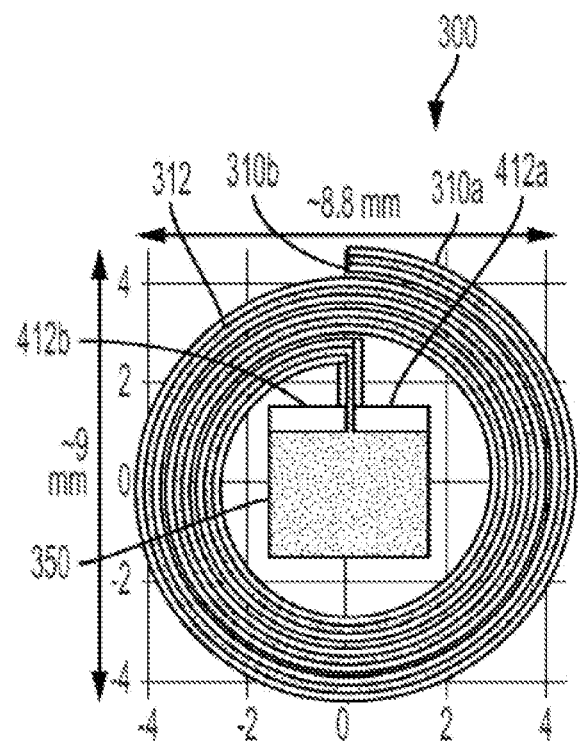
FIGS. 3A and 3B are top and side views of an example of a piezoelectric bimorph according to aspects of the present invention.

As shown in FIG. 3A, piezoelectric bimorph 125 comprises a first conductive layer and a second conductive layer. As is well known, bending of such a bimorph produces a voltage and a corresponding charge accumulation. As described with reference to FIGS. 5A-5C, according to aspects of the present invention, a charge is generated when mass 120 is caused to move when module 100 is exposed to a vibratory signal. Also, as described in greater detail below, a capacitive element 425 is electrically coupled to bimorph 125 via a rectifier 410, which allows for collection of the charge on the capacitive element. The bimorph may be constructed as any suitable shape. For example, the bimorph may be constructed as a beam or as a spiral (shown in FIG. 3A). It will be appreciated that bimorph 300 operates as what is conventionally known as an energy harvester. Although in the illustrated embodiment a bimorph is used to collect charge and produce a corresponding voltage, aspects of the present invention are not so limited; and an energy harvester for use in aspects of the present invention may take any suitable form capable of generating a charge/voltage for output in response to vibratory signal. For example, the energy harvester may comprise an electromagnetic energy harvester with a magnet disposed on the mass 120 to induce a charge on a pick-up coil mounted on base 105, wall 130 or another portion of a frame (described below) or the energy harvester may comprise a triboelectric energy harvesters (TENG) that generates charge from contact and friction. For example, in such embodiments, mass 120 and base 105, wall 130 or another portion of a frame are coated or made of materials that produce a triboelectric affect when in contact and moved relative to one another.

Wall 130 is configured to position first electrode 132a and second electrode 132b a selected distance from first location 102. Conductive element 127 is positioned and sized to contact first wall electrode 132a and second wall electrode 132b when spring 110 is flexed a first amount. Vibrations of module 100 cause charge to be generated in the manner described above; however, when the vibratory signal exceed the first amount, conductive element 127 contacts first electrode 132a and second electrode 132b, simultaneously, and as described in greater detail below, causes a discharge of capacitive element 425 (shown in FIG. 4B).

Although in the above description mass 120 is coupled to a simple, horizontally-extending structure (i.e., base 105), in some embodiment, the base may constitute a portion of a more complex structure (referred to herein as a frame) extending in more than one direction around mass 120. The frame may be constructed as a single integrated structure (e.g., the frame is molded or 3D printed as a single piece). In some embodiments, the frame entirely surrounds mass 120. In some embodiments, wall 130 forms a part of the frame. In some embodiments, the mass is connected to the frame with more than one spring 110, which together control the response of the mass to vibrations.

It will be appreciated that construction of spring 110 and mass 120 can be determined experimentally by placing a module 100 on a shaker table shaking the module a selected frequency and amplitude, and adjusting dimensions of the spring and mass until conductive element 127 contacts first wall electrode 132a and second wall electrode 132b at a desired frequency and magnitude.

Figure 2:
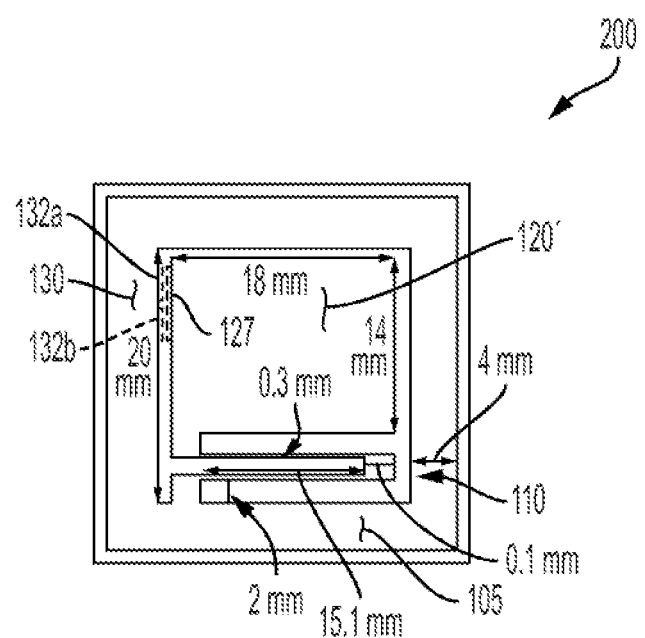
FIG. 2 is a schematic of an example of components of a vibration transducer module according to aspects of the present invention showing selected dimensions.

FIG. 2 is a schematic of an example of base 105, spring 110, mass component 120 and a wall 130 forming an integrated vibration transducer module platform 200 according to aspects of the present invention showing selected dimensions. For example, the illustrated module is formed using a 3D printing of a polylactic acid (PLA) (available from MakerBot Brooklyn, N.Y.) having a thickness of 3 mm. Any other suitable material may be used, such as Acrylonitrile Butadiene Styrene, for example having a thickness suitable for mounting and operating as an energy harvester as described herein.

Referring again to FIG. 1, in some embodiments, mass 120, base 105, wall 130 and one or more of spring 110, are configured as discrete component suitably connected one or more of the other component using a fastener (e.g., a screw) or an adhesive. In some embodiments, as shown in FIG. 2, spring 110, mass 120, base 105 and wall 130 are formed as one integrated unit. For example, the unit may be molded, or formed using 3D printing techniques. Electrodes 132a and 132b, and conductive element 127 are shown with dashing to clarify their positioning in the illustrated embodiment. It will be appreciate the sizes of electrodes 132a and 132b can be adjusted to help ensure contact with conductive element 127.

Figure 3B:
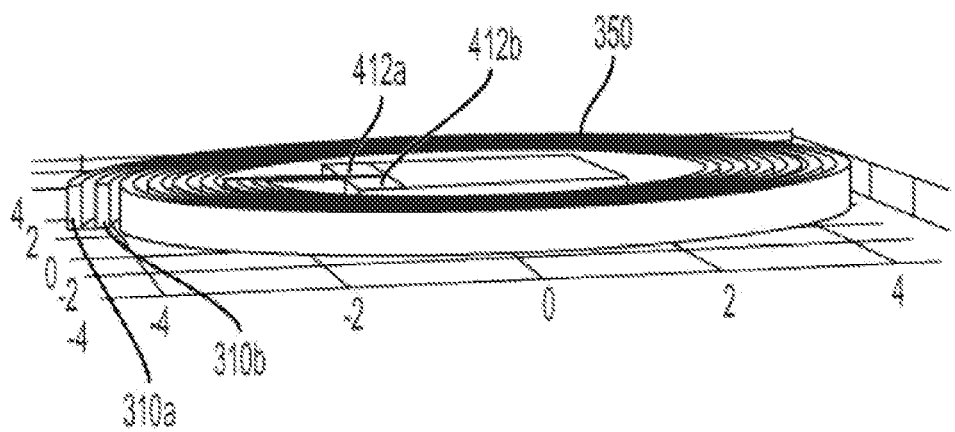

FIGS. 3A and 3B are top and side views, respectively, of an example of an embodiment of a spiral piezoelectric bimorph 300 according to aspects of the present invention. Bimorph 300 comprises a first conductor layer 310a (e.g., a layer of silver or copper), a second conductor layer 310b (e.g., a layer of silver or copper), and a piezoelectric layer 312 between layers 310a and 310b.

As the spiral beam bends in-plane (i.e., the plane of FIG. 3A), one of layers 310a, 310b is subject to compressive strain while the other of layers 310a, 310b is subject to tensile strain. Thus, a differential voltage output is established between electrodes 320a, 320b which are electrically coupled to layer 310a and 310b, respectively. In some embodiments, an electrode may be present to permit one of electrodes 132a and 132b to be connected to ground. The spiral of bimorph 300 is connected to an anchor 350 and, in the illustrated embodiment, electrodes 320a and 320b are formed on anchor 350. For example, the ground may be provided on the bottom of anchor 350. It will be appreciated that a spiral design provides the energy harvester with in-plane symmetry and a more compact design than a cantilever beam of equal length.

For example, the spiral bimorph 300 illustrated in FIGS. 3A and 3B may be fabricated by laser micromachining a layer of PZT (Lead zirconate titanate), using a top conductive layer (e.g., made of silver or another metal) and a bottom conductive layer (e.g., made of silver or another metal). For example, a 0.5 mm thick PZT-4 plate having a conductive layer (e.g., silver) on top and a conductive layer on bottom can be laser micromachined using a Protolaser U from LPKF Laser & Electronics AG of Garbsen, Germany. Formation of bimorph 300 can be achieved through a single step, no mask, process. An example of such micromachining is described, for example in United States Published Patent Application 2016/0072041 which is hereby incorporated by reference herein. As illustrated in FIG. 3B, in some embodiments, middle layer of PZT is further etched 0.25 mm, halfway through its thickness (i.e., height) during the laser removal in order to reduce the effective thickness of the device (and thus the spring constant of the spiral) thereby making the bimorph more sensitive to in-plane and out-of-plane accelerations.

Figure 4A:
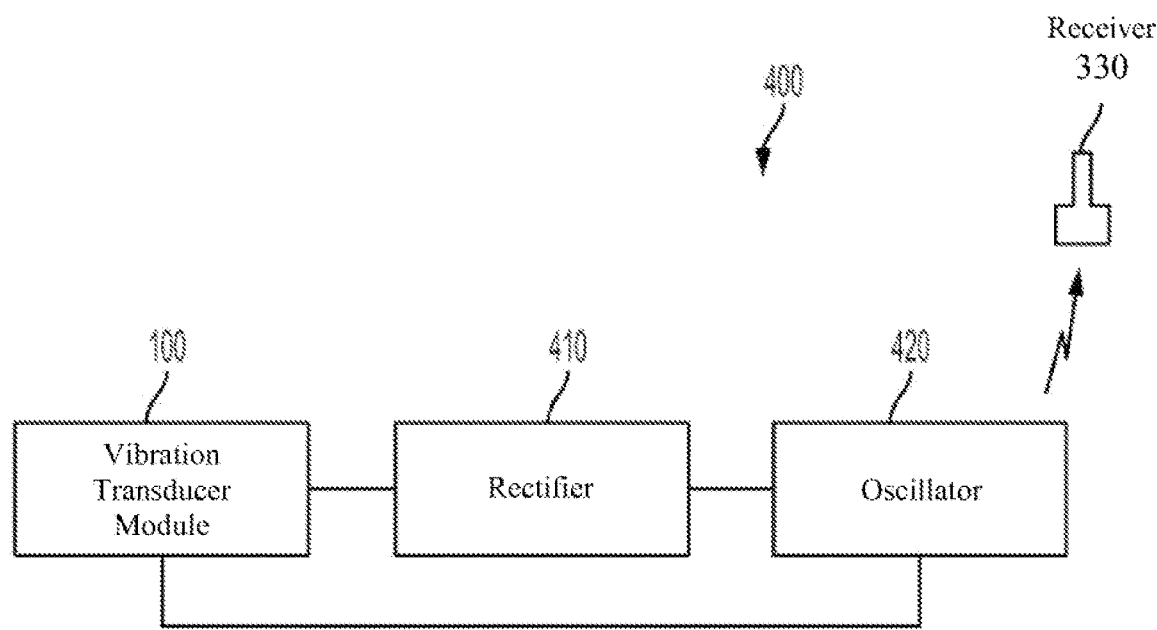
FIG. 4A is a block diagram of an example of a sensor for detecting vibratory signals according to aspects of the present invention.

FIG. 4A is a block diagram of an example of a sensor 400 for detecting vibratory signals according to aspects of the present invention. Sensor 400 comprises a vibration transducer module 100 as described above, a rectifier 410 and an oscillator 420. Rectifier 410 receives a first voltage signal from bimorph 125 (shown in FIG. 1) or other energy scavenger of module 100. It will be appreciated that the first voltage signal corresponds to the charge generated by the bimorph in response to a vibratory signal. Rectifier 410 provides a rectified version of first voltage signal as an output to a capacitive element of oscillator 420. This configuration allows charge accumulation to occur on the capacitive element. Oscillator 420 has an open state in which the capacitive element accumulates charge, and a closed state in which the capacitive element forms an oscillating circulate with other components of the oscillator.

Oscillator 420 can take any known form of an oscillator comprising a capacitive element. For example, in some embodiments, in addition to the capacitive element, oscillator 420 may comprise an inductive element. It will be appreciated that, in such embodiments, when the oscillator attains the closed state, oscillation will occur and a relatively high frequency electromagnetic output can be generated. The frequency of the electromagnetic output can be determined by selecting values of the capacitive element and the inductive element in a conventional manner. It will be appreciated that a given electromagnetic output can be associated with charge from a single large vibration, or a series of smaller vibrations (which do not result in oscillation) and a large vibration that results in the oscillation.

In other examples, oscillator 420 is a surface acoustic wave (SAW) device and, in the open state, the charge from the bimorph is accumulated on a capacitive element of the SAW device. It will be appreciated that when the SAW device is switched to a closed state, oscillation will occur resulting in a relatively high frequency electromagnetic output. The charging of the SAW interdigital transducers using the energy harvester output leads to a stress buildup in the SAW piezoelectric substrate. When the charge is suddenly released (i.e., due to conductive material 127 contacting electrodes 132a and 132b), the mechanical strain will remain as it cannot dissipate at the same speed as the charge. The stored mechanical strain then is released resulting in a SAW wave that travels to the interdigital transducers and is coupled into a transmitter antenna (not shown). It will be appreciated that a receiver antenna 330 may be used to detect the high frequency output.

Figure 4B:
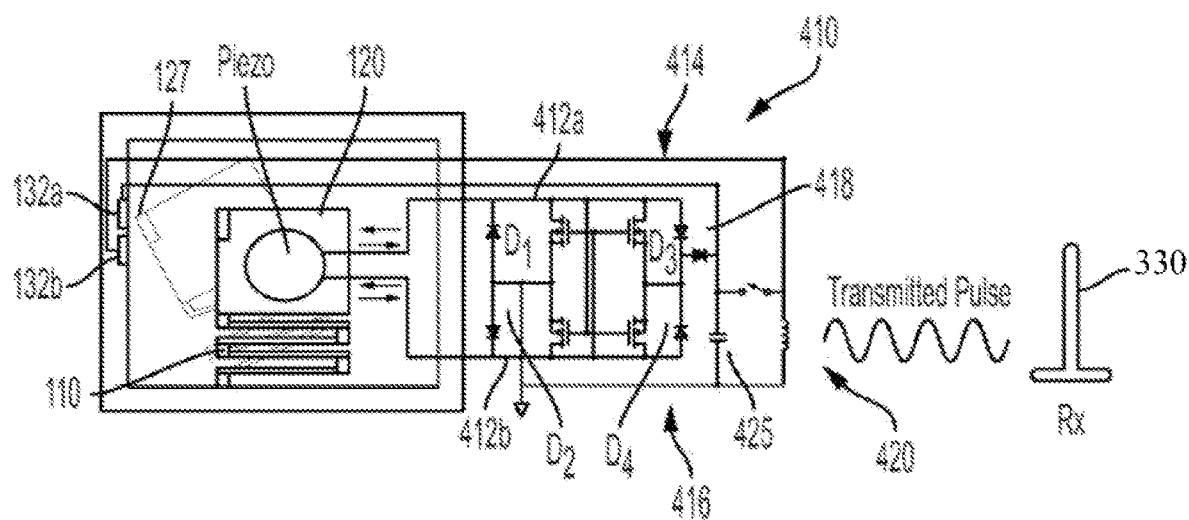
FIG. 4B is a schematic diagram of an example of a sensor for detecting vibratory signals and providing a corresponding high frequency output according to aspects of the present invention.

FIG. 4B is a schematic diagram of an example of an embodiment of a sensor 450 for detecting vibratory signals and providing a corresponding high frequency output according to aspects of the present invention. Sensor 450 comprises a vibration transducer module 100, a rectifier 410, and an oscillator 420.

Rectifier 410 has an input (i.e., first rectifier electrode 412a and the second rectifier electrode 412b) coupled to the energy harvester. Rectifier 410 receives a first voltage signal from bimorph 300 at the first input. Rectifier 410 is adapted to provide a rectified first voltage signal as an output to capacitive element 425.

Oscillator 420 comprises capacitive element 425 which is coupled to receive and maintain a charge corresponding to the rectified first voltage signal from rectifier 410. When a vibratory signal causes mass 120 to flex spring 110, a charge corresponding to the rectified first voltage signal is generated by the bimorph, and transferred to and maintained on the capacitive element 425. When the vibratory signal causes mass 120 to flex the spring 110 at least the first amount, conductive element 127 contacts wall electrode 132a and wall electrode 132b, such that wall electrode 132a is electrically coupled to the second wall electrode 132b. As a result, capacitive element 425 is electrically coupled to inductor 527 to form an oscillating circuit. The charge accumulated on capacitive element 425 is cyclically transferred to inductor 527 and back to capacitive element 525 in a well-known manner (i.e., the oscillator is caused to oscillate). It will be appreciated that, by selecting values of capacitor 425 and inductor 527, an electromagnetic output of a desired high frequency can be established.

In the illustrated embodiment, rectifier 410 is implemented as a "zero-drop" full-bridge rectifier comprising a MOSFET bridge rectifier 414. Optionally, as illustrated, a full-wave diode rectifier 416 (comprising diodes $D_1$-$D_4$) may be provided. The full-wave diode bridge rectifier may have a lower turn-on voltage than the MOSFETs. Accordingly, for lower voltages, an AC signal from the bimorph output will be rectified through the diode bridge.

As described above, capacitive element 425 receives the output of rectifier 410 to store the charge from bimorph 300 (or other energy harvester) until first wall electrode 132a and the second wall electrode 132b are electrically coupled together by conductive element 127 (i.e., due to relatively large vibration). It will be appreciated that the charge is dissipated when the electromagnetic energy is emitted by the oscillator. Optionally, an additional rectifier 418 may be added before capacitive element 425 so that capacitive element 425 cannot discharge back through the MOSFETs.

Although a specific design of an example of a rectifier having specific advantages is described above, it will be appreciated that any suitable full-wave or half-wave rectifier may be used with or without a MOSFET bridge rectifier.

Figure 5A:
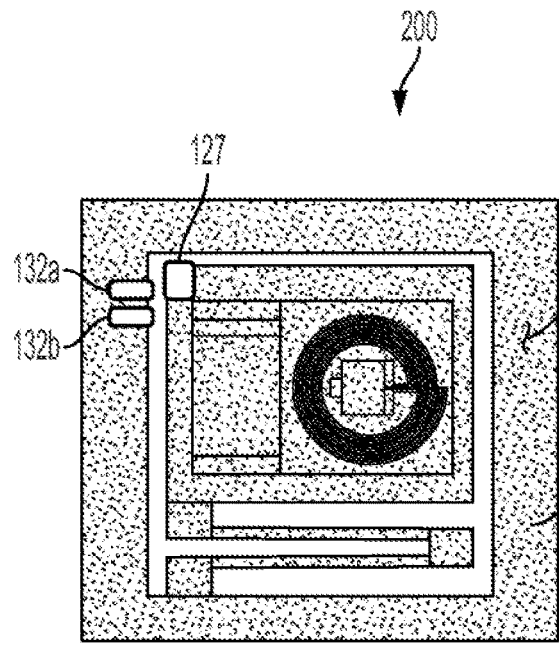
FIGS. 5A-5C are schematic illustrations of an example of a vibration transducer module according to aspects of the present invention, in various states of operation.
Figure 5B:
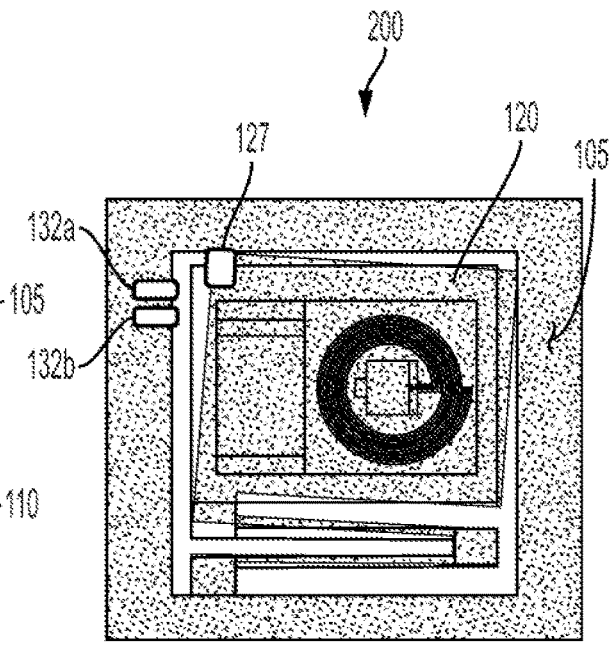
Figure 5C:
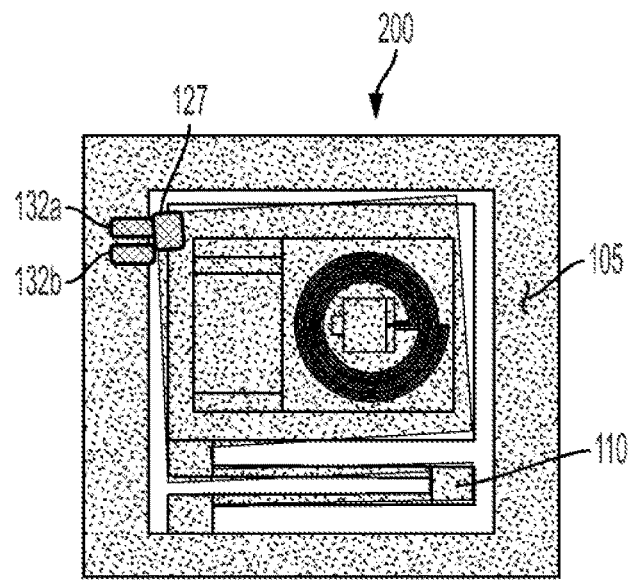
Figure 6:
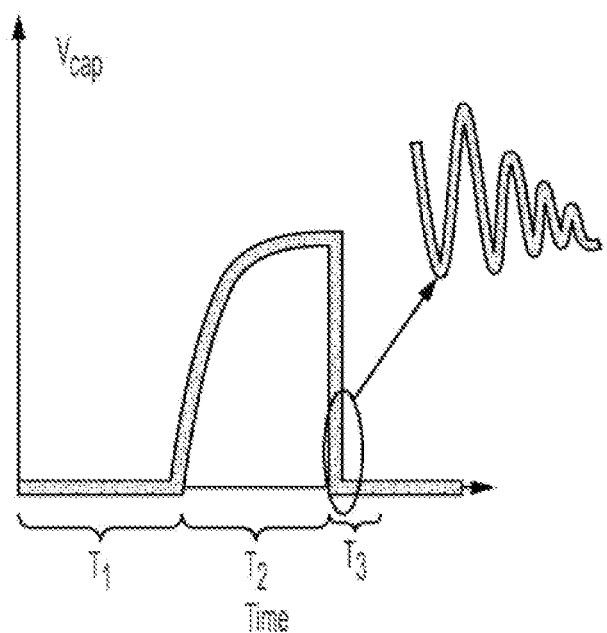
FIG. 6 is graphical illustrations of the voltage present on the capacitive element shown in FIG. 4B during the various states of operation shown in FIGS. 5A-5B.

FIGS. 5A-5C are schematic illustrations of an example of a vibration transducer module 200 according to aspects of the present invention, in various states of operation; and FIG. 6 is a graphical illustration of the voltage present on capacitive element 425 (e.g., shown in FIG. 4B) during the various states of operation shown in FIGS. 5A-5B. FIG. 5A is an illustration of module 200 when spring 110 is in a relaxed state. As shown in FIG. 5A, when spring 110 is in the relaxed state, conductive element 127 is separated from first electrode 132a and second electrode 132b. In FIG. 6, time segment $T_1$ corresponds to the relaxed state shown in FIG. 5A. During time segment $T_1$, a constant voltage (e.g., V=0) is present on capacitive element 425.

As shown in FIG. 5B and corresponding time segment $T_2$, contact of mass 120 with frame 105 that does not result in conductive element 127 contacting both first electrode 132a and second electrode 132b, causes a charge to be generated by bimorph 125 (shown in FIG. 1) which is accumulated on capacitive element 425 resulting in a voltage increase during time segment $T_2$. FIG. 5C is an illustration of module 200 when spring 110 is in an extended state in which conductive element 127 is in contact with both first electrode 132a and second electrode 132B. As shown in FIG. 6C, the contact results in discharge of the capacitive element and oscillation of the oscillator 420 (shown in FIG. 4B). The charge may include any charge generated by contacting the frame including charge generated when contacting the wall electrodes. The amplitude of the oscillation decreases with time, due to the output of electromagnetic energy.

Figure 7A:
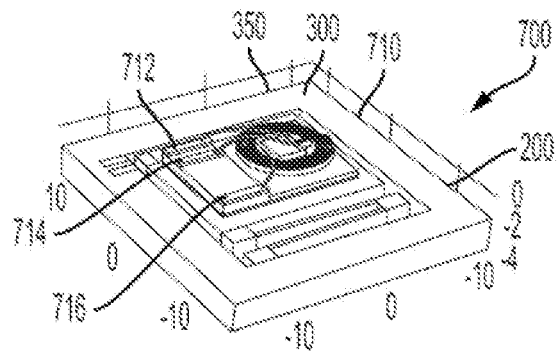
FIGS. 7A and 7B are schematic illustrations of an assembled and a partially disassembled example of a sensor for detecting vibratory signals according to aspects of the present invention.
Figure 7B:
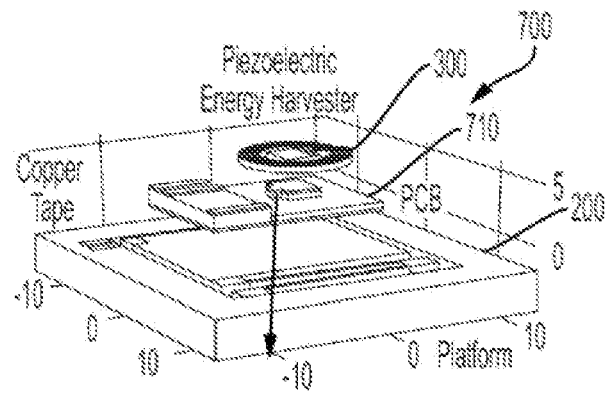

FIGS. 7A and 7B are schematic illustrations of an example of a sensor 700 for detecting vibratory signals according to aspects of the present invention in an assembled state and a disassembled state, respectively.

Anchor 350 is connected to a printed circuit board 710 (e.g., using conductive silver paint to form the ground). Printed circuit board 710 is attached to integrated platform 200. It is to be appreciated that anchor 350 of bimorph 300 is attached to the printed circuit board (e.g., using an adhesive or a connector), and the surrounding spiral structure hangs off printed circuit board 710 so that bimorph structure can bend freely in response to a vibratory signal. Printed circuit board 710 may be connected to integrated platform 200 using a connector (such as a screw) or an adhesive. Pads 712 and 714 are connected to electrode 412a and 412b, respectively, to provide the output voltage from the bimorph, and pad 716 connects to the ground. The rectifier and oscillator circuits may be formed on the printed circuit board 710 or the frame or any other suitable location.

In some embodiments, a vibration sensor apparatus is formed with more than one vibration sensor 400 (not shown). Each sensor is configured to have different response characteristics to vibrations. For example, each sensor has a vibration transducer module 100 having different masses and/or different spring constants. It will be appreciated that such a configuration allows a sensor to be sensitive to a broad range of vibration frequencies.

It will be appreciated that sensors according to aspects of the present invention may be used in a variety of applications as vibration sensors and/or accelerometers, and that a sensor can be operated without a need for battery. The following are examples of applications of sensors according to aspects of the present invention. Example 1—a sensor may be used in traffic monitoring by locating the sensor proximate to where vehicles pass (e.g., on the pavement), with the sensor being used to register vibrations from each vehicle and to send a high frequency signal to register the passing of the vehicle. It will be appreciated that, if two or more sensors are positioned at different locations, the time between high frequency signals can be used to register the speed of the vehicle. Example 2—a sensor may be located near a container or pipe having high pressure contents. If the container or pipe were to burst, the resulting vibrations could be used to register the vibrations and send a signal in response. Example 3—a sensor could be used as a fitness tracker such as a pedometer where the vibrations associated with each step can be registered. Example 4—a sensor or a series of sensors could be used to measure wind speed. Example 5—a sensor could be used to detect vibrations associated with speech. Example 5—a sensor could be used in conjunction with a security system to register footsteps. Example 6—a sensor could be embedded into a bed to measure quality of sleep.

Although various embodiments have been depicted and described in detail herein, it will be apparent to those skilled in the relevant art that various modifications, additions, substitutions, and the like can be made without departing from the spirit of the invention and these are therefore considered to be within the scope of the invention as defined in the claims which follow.

What is claimed:

1. A method of sensing a vibratory signal, comprising:
vibrating a mass-spring system comprising a mass comprising an energy harvester and a conductive element, the energy harvester being electrically connected to the conductive element;
wherein the energy harvester comprises a piezoelectric bimorph including a
first conductive layer,
a second conductive layer, and
a piezoelectric layer disposed therebetween,
a housing comprising a base and a wall, the wall having a first electrode and a second electrode positioned in or on the wall,
a spring having a proximal end and a distal end,
wherein the proximal end of the spring is connected to the base at a first location, and
wherein the mass is mechanically coupled to the distal end of the spring,
wherein the mass is configured to move between a first position and a second position responsive to movement of the housing, and wherein the conductive element contacts the first electrode and the second electrode when the mass is at the second position;
outputting a charge from the energy harvester to a charge collector of an oscillator in response to movement of the mass between the first position and the second position; and
generating an oscillatory signal by activating the oscillator with the conductive element.

2. The method of claim 1, wherein the piezoelectric bimorph is a spiral bimorph.

3. The method of claim 1, wherein the act of generating an oscillatory signal comprises establishing an electrical connection of the capacitor to an inductive element via the conductive element.

4. The method of claim 1, wherein the oscillator comprises a surface acoustic wave device.

5. A vibration transducer module for detecting a vibratory signal, comprising:
- a housing comprising a base and a wall;
- a spring having a proximal end and a distal end, the proximal end of the spring being connected to the base at a first location;
- a mass mechanically coupled to the distal end of the spring, the mass comprising a conductive element and an energy harvester electrically connected to the conductive element, the mass configured to move between a first position and a second position responsive to movement of the housing; and
- a first electrode and a second electrode positioned in or on the wall at a position at which the conductive element contacts the first electrode and the second electrode when the mass is at the second position,
- wherein the energy harvester comprises a piezoelectric bimorph including a first conductive layer, a second conductive layer, and a piezoelectric layer disposed therebetween, the energy harvester being configured to output a first voltage to a charge collector responsive to movement of the mass between the first position and the second position.

6. The vibration transducer module of claim 5, wherein the spring is a serpentine spring.

7. The vibration transducer module of claim 5, wherein the piezoelectric layer comprises lead zirconate titanate.

8. The vibration transducer module of claim 5, wherein the piezoelectric bimorph is a spiral bimorph.

9. The vibration transducer module of claim 5, wherein the base constitutes a portion of a frame extending in more than one direction around the mass.

10. The vibration transducer module of claim 9, wherein the wall constitutes a portion of the frame.

11. The vibration transducer module of claim 10, wherein the frame is a single integrated structure.

12. A vibration sensor incorporating the module of claim 5, further comprising:
- a rectifier having an input coupled to the energy harvester to receive the first voltage and adapted to provide a rectified first voltage signal as an output; and
- an oscillator comprising a capacitive element coupled to receive and maintain a charge corresponding to the rectified first voltage signal from the rectifier, the oscillator being configured to oscillate when the conductive element contacts the first electrode and the second electrode.

13. The vibration sensor of claim 12, wherein the oscillator further comprises an inductive element coupled to the capacitive element.

14. The vibration sensor of claim 12, wherein the oscillator is a surface acoustic wave device.

15. The vibration sensor of claim 12, wherein the rectifier is a full-wave rectifier.

* * * * *